United States Patent [19]

Miyatake

[11] Patent Number: 4,982,367
[45] Date of Patent: Jan. 1, 1991

[54] DYNAMIC RANDOM ACCESS MEMORY WITH WELL-BALANCED READ-OUT VOLTAGE ON BIT LINE PAIR AND OPERATING METHOD THEREFOR

[75] Inventor: Hideshi Miyatake, Hyogo, Japan

[73] Assignee: Mitsubishi Denki Kabushiki Kaisha, Tokyo, Japan

[21] Appl. No.: 192,575

[22] Filed: May 11, 1988

[30] Foreign Application Priority Data

May 15, 1987 [JP] Japan ................ 62-119207

[51] Int. Cl.$^5$ .............................. G11C 7/00
[52] U.S. Cl. ........................ 365/203; 365/210
[58] Field of Search ............. 365/202, 203, 149, 190, 365/210, 233

[56] References Cited

U.S. PATENT DOCUMENTS 4,780,850 10/1988 Miyamoto et al. ............. 365/203 X
4,792,922 12/1988 Mimoto et al. ................. 365/203 X
4,799,196 1/1989 Takemae ......................... 365/210 X

OTHER PUBLICATIONS

Sunichi Suzuki, "A 128K Word by ×8 Bit DRAM", *IEEE Journal of Solid-State Circuits*, vol. SC-19, No. 5 (Oct., 1984): 624, 626.

Shozo Saito et al., "A 1 Mb CMOS DRAM with Fast Page and Static Column Modes", 1985 *IEEE International Solid-State Circuits Conference* (Feb. 15, 1985): 252, 253.

Nicky Chau-Chun Lu, "Half-$V_{DD}$ Bit-Line Sensing Scheme in CMOS DRAM's", IEEE Journal of Solid-State Circuits, vol. SC-19, No. 4 (Aug. 1984) 451, 454.

*Primary Examiner*—Stuart N. Hecker
*Assistant Examiner*—Andrew L. Sniezek
*Attorney, Agent, or Firm*—Lowe, Price, LeBlanc, Becker & Shur

[57] ABSTRACT

A DRAM comprises equalizing capacitance for equalizing the difference between a potential on a bit line to which a selected memory cell is connected and a potential on a reference bit line paired with the bit line when the selected memory cell stores "H" information and that when the selected memory cell stores "L" information, before sensing operation is started. The amplitude of a potential on a selected word line is at an operating power-supply voltage Vcc level of the DRAM.

22 Claims, 6 Drawing Sheets

PRECHARGED BIT LINE POTENTIAL

ELECTRON POTENTIAL ON A BIT LINE WHEN "L" DATA IS READ OUT BEFORE SENSING

ELECTRON POTENTIAL ON A BIT LINE WHEN "H" DATA IS READ OUT BEFORE SENSING $\Delta V_{LR}$ : POTENTIAL DIFFERENCE $\Delta V_{HR}$ : POTENTIAL DIFFERENCE IMPARTED ON A BIT LINE PAIR WHEN "H" DATA IS READ OUT

DYNAMIC RANDOM ACCESS MEMORY WITH WELL-BALANCED READ-OUT VOLTAGE ON BIT LINE PAIR AND OPERATING METHOD THEREFOR

BACKGROUND OF THE INVENTION

1. Field of the Invention

The present invention relates generally to dynamic random access memories (DRAM), and more particularly, to a method of and circuitry for reading data from a DRAM, wherein the magnitude of difference of potential imparted to a bit line pair, as a result of "H" or "L" data on a selected memory cell as the cell is connected to the bit line pair, is equalized.

2. Description of the Prior Art

Recently, in a dynamic random access memory, from a view point of low power dissipation and fast read operation, periphery circuitry consisting of CMOS transistors and precharging of a bit line to half of an operating power-supply voltage Vcc or ½ Vcc have been a major trend, which is described in, for example, an article by Nicky Chau-Chun Lu et al., entitled "Half-$V_{DD}$ Bit-Line Sensing Scheme in CMOS DRAM's", IEEE Journal of Solid-State Circuits, Vol. SC-19, No. 4, Aug. 1980, pp. 451–454.

Figure 1:
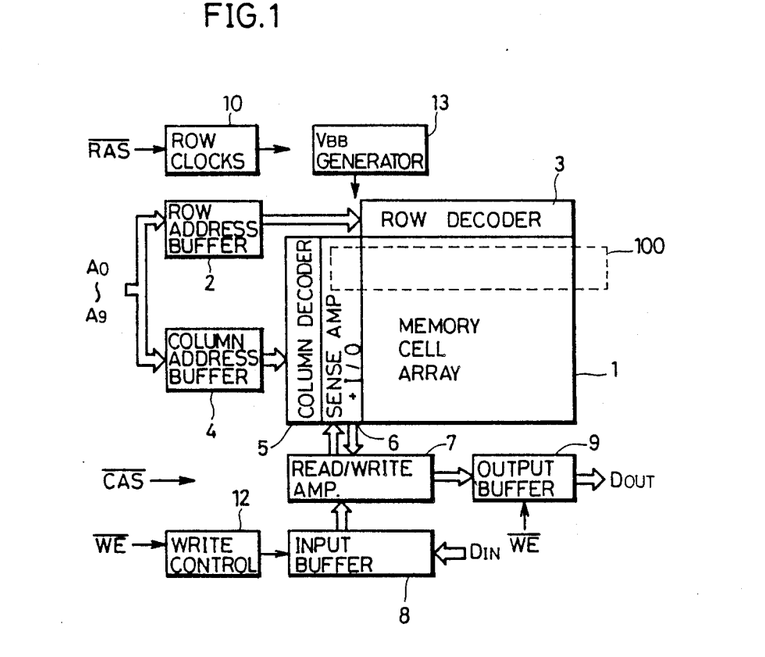
FIG. 1 is a diagram showing schematically the whole structure of a conventional DRAM having a half-Vcc precharge scheme.

FIG. 1 is a diagram showing schematically the whole structure of a conventional half-Vcc precharging DRAM.

Referring to FIG. 1, the conventional DRAM comprises a memory cell array 1 in which a plurality of memory cells each having digital information of an "H" or "L" level stored in the form of charges are arranged in a matrix of rows and columns. A row address buffer 2 receiving a row address (A0 to A9) externally applied for generating an internal row address, and a row decoder 3 responsive to an internal row address from the row address buffer 2 for generating a signal for selecting one row in the memory cell array 1 are provided for selecting a word line. A column address buffer 4 receiving a column address externally applied for generating an internal column address and a column decoder 5 responsive to an internal column address from the column address buffer 4 for generating a signal for selecting one column in the memory cell array 1 are also provided with the DRAM for selecting a column or a bit line pair. For communicating data signals with external circuitry, in the DRAM, further provided are a (sense amplifier +I/O) block 6 comprising sense amplifiers for sensing and amplifying information on each column (bit line) in the memory cell array 1 and I/O gates responsive to an output of the column decoder 5 for connecting the selected column to a read/write amplifier 7, an input buffer 8 receiving input data $D_{IN}$ externally applied for applying the same to the read/write amplifier 7, and an output buffer 9 receiving the data from the read/write amplifier 7 for applying output data $D_{OUT}$ to the exterior. The read/write amplifier 7 amplifies an applied signal and applies the same to a circuit in the subsequent stage.

As peripheral circuits, there are provided row clock generator 10 responsive to a signal $\overline{RAS}$ (row address strobe) externally applied for generating signals of defining operation timings associated with row selection, a write control circuit 12 responsive to a write enable signal $\overline{WE}$ externally applied for generating a signal of designating a read/write operation of the DRAM, and a $V_{BB}$ generator 13 for generating a voltage $V_{BB}$ for supplying a precharge voltage of bit lines in the memory cell array 1.

FIG. 1 shows an address multiplexing scheme in which a row address and a column address are applied in a time divisional manner. Operation timing of the row address buffer 2 is provided by the signal $\overline{RAS}$, and operation timing of the column address buffer 4 is defined by a signal $\overline{CAS}$.

Figure 2:
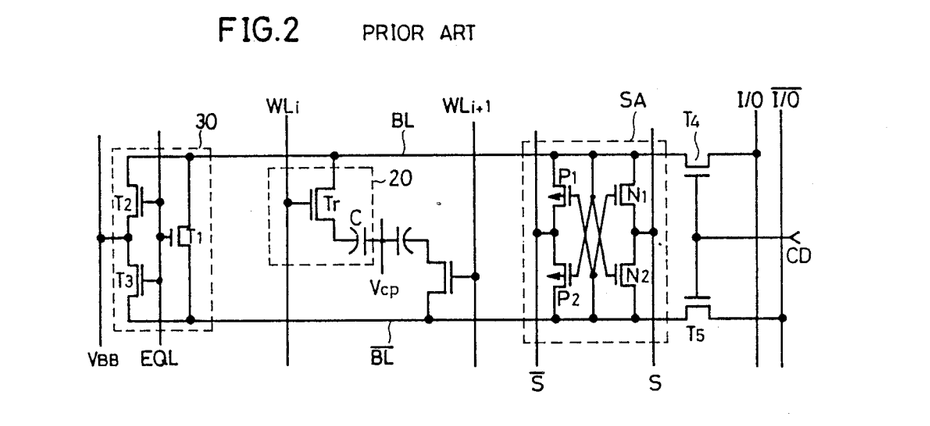
FIG. 2 is a diagram showing structure of a pair of bit lines in a memory cell array in the conventional DRAM and portions associated therewith.

FIG. 2 shows an example of structure of the memory cell array in the conventional DRAM, showing structure of a block 100 represented by a broken line shown in FIG. 1. In FIG. 2, only structure associated with a pair of bit lines BL and $\overline{BL}$ and two word lines $WL_i$ and $WL_{i+1}$ is typically shown.

Referring to FIG. 2, a memory cell 6 for storing digital information of "H" or "L" level in the form of charges comprises a single transistor Tr and a single capacitor C. The memory capacitor C has one electrode (a cell plate) connected to a predetermined potential Vcp and another electrode (a storage node) connected to a drain of the transistotr Tr. The transistor Tr has its source connected to the bit line BL and its gave connected to the word line WLi.

In order to differentially amplify a signal voltage on the pair of bit lines BL and $\overline{BL}$, the bit line pair is provided with a sense amplifier SA. The sense amplifier SA comprises a pMOS sense amplifier responsive to a sense amplifer activating signal $\overline{S}$ for boosting a potential on a bit line of a higher potential to a power-supply potential Vcc level and an nMOS sense amplifier responsive to a sense amplifier activating signal S for discharging a potential on a bit line of a lower potential to a ground potential. The pMOS sense amplifier comprises two pMOS transistors P1 and P2 having their gates and drains cross-coupled. The nMOS sense amplifier comprises two nMOS transistors N1 and N2 having their gates and drains cross-coupled.

In order to maintain each of the bit lines BL and $\overline{BL}$ at a precharge potential $V_{BB}$ after activation of a word line selected by an external address is completed (or in stand-by state), a precharge/equalize block 30 is provided. The precharge/equalize block 30 comprises an equalizing transistor T1 responsive to an equalize signal EQL for electrically connecting the paired bit lines BL and $\overline{BL}$, a precharging transistor T2 responsive to the equalize signal EQL for transmitting to the bit line BL a precharge voltage $V_{BB}$ from the $V_{BB}$ generator (see FIG. 1), and a precharging transistor T3 responsive to the equalize signal EQL for transmitting to the bit line $\overline{BL}$ the precharge potential $V_{BB}$ from the $V_{BB}$ generator. The bit lines BL and $\overline{BL}$ are connected, respectively, to data input/output buses I/O and $\overline{I}/$ through transfer gate transistors T4 and T5 which are in turn responsive to a column selecting signal (column decode signal) CD from the column decoder (see FIG. 1) to be turned on.

The sense amplifier activating signal S and $\overline{S}$ and the equalize signal EQL are generated in response to the signal $\overline{RAS}$ which is a basic operation timing signal of the DRAM.

Furthermore, the precharge voltage $V_{BB}$ is generally set to half of the operating power-supply voltage Vcc.

Figure 3A:
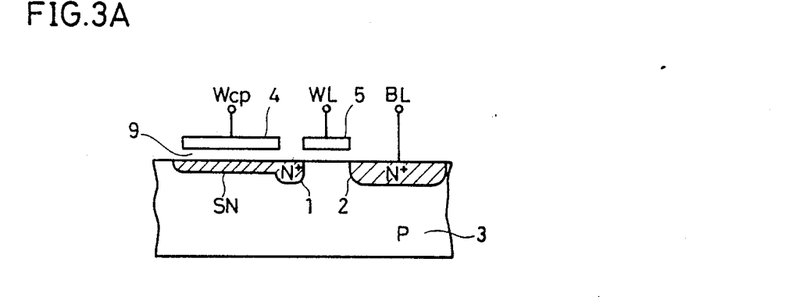
FIG. 3A is a diagram showing a cross-sectional structure of a memory cell.
Figure 3B:
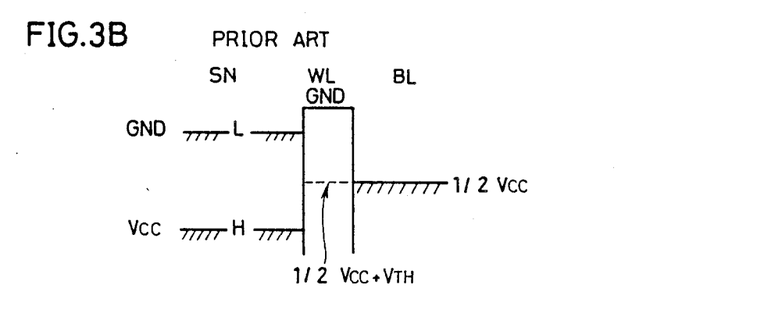
FIG. 3B is a diagram showing electron potentials under portions of a memory cell.
Figure 3C:
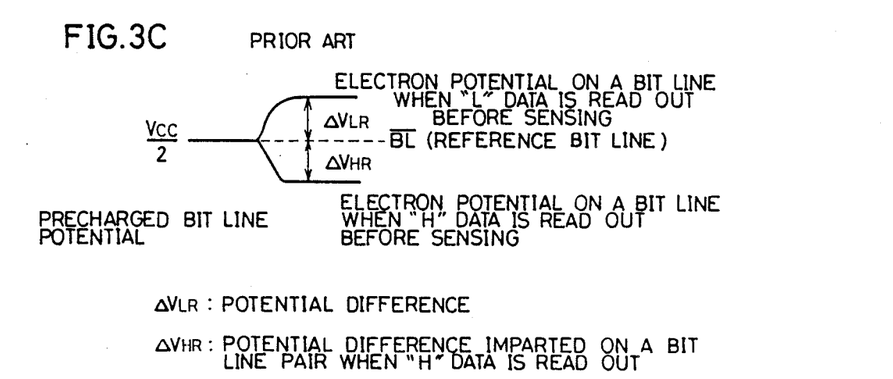
FIG. 3C is a diagram showing electron potentials under a bit line in reading out "L" information and "H" information stored in the memory cell.

FIGS. 3A to 3C are diagrams showing cross-sectional structure of a memory cell, an electron potential under each portion and a read-out waveform which appears on a bit line, in the conventional dynamic RAM. FIG. 3A shows cross-sectional structure of the memory cell. In FIG. 3A, a memory cell 6 comprises an N+ type impurity diffusion layer 2 constituting a bit line BL (or $\overline{BL}$) formed in a predetermined region on a P type semiconductor substrate 3 and an N+ diffusion layer 1 constituting a storage node SN of the memory cell. A transistor portion Tr of the memory cell comprises a gate 5 constituting a word line WL and the N+ type impurity diffusion layers 1 and 2. Storage capacitance C of the memory cell comprises a cell plate 4 coupled to a cell plate potential Vcp, an insulating film 9 and the storage node SN. FIG. 3B is a diagram showing electron potentials under the storage node SN, the word line WL and the bit line BL. The electron potential under the storage node SN shows electron potentials formed when the memory cell stores information of the "L" and "H" levels, respectively. The electron potential under the word line WL shows electron potentials formed under the word line when a ground potential GND and $Vcc/2 + V_{TH}$ (where $V_{TH}$ is a threshold voltage of the transistor Tr of the memory cell) are applied on the word line, respectively. The electron potential under the bit line BL shows an electron potential formed when the bit line BL is precharged to Vcc/2.

FIG. 3C is a diagram showing by an electron potential a read-out waveform generated when information stored in the memory cell is read out to the bit line before sensing (or a sense amplifier is activated). When the memory cell having information of the "L" level is accessed, the electron potential under the bit line is increased by $\Delta V_{LR}$, with respect to the precharge level. On the other hand, when the memory cell having information of the "H" level is accessed, the electron potential under the bit line is decreased by $\Delta V_{HR}$, relative to the precharge level.

Figure 4:
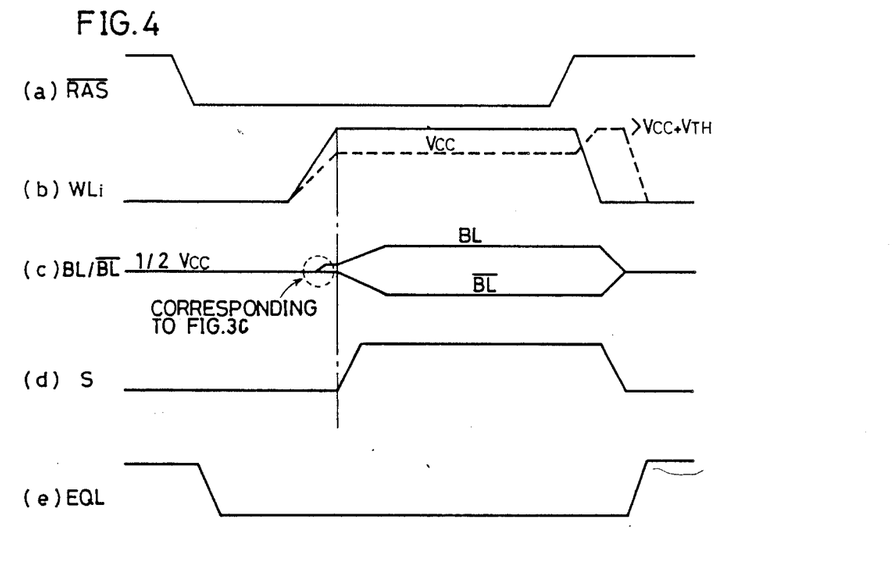
FIG. 4 is a waveform diagram of signals showing a read operation of the conventional DRAM.

FIG. 4 is a waveform diagram showing an operation in reading out information of the "H" level in the conventional dynamic RAM shown in FIGS. 1 and 2. Referring now to FIGS. 1 to 4, description is made on an operation for reading out the information of the "H" level in the conventional dynamic RAM. When a signal $\overline{RAS}$ is rendered active in synchronization with the fall of the external $\overline{RAS}$ signal which is a basic timing signal of the DRAM, an external address is accepted in the dynamic RAM. When the memory cell stores the information of the "L" level, charges of a ground potential level are stored in the storage node SN. On the other hand, when the memory cell stores the information of the "H" level, charges of a Vcc level are stored therein.

After the $\overline{RAS}$ signal falls, a single word line is selected in response to the accepted external address and a potential on the selected word line WLi rises by word line driving means included in an output portion of the row decoder. In the case the memory cell stores the informatin of the "L" level, electrons start to flow from the memory cell to the bit line BL (it is assumed that BL represents a bit line connected to the selected memory cell) when the potential on the selected word line WLi exceeds $V_{TH}$. When the potential on the word line WLi attains $Vcc/2 + V_{TH}$, all charges stored in the memory cell flow out on the bit line BL, so that the electron potential under the bit line BL is increased by a very small voltage $\Delta V_{LR}$. On the other hand, as shown in FIG. 4, in the case the memory cell stores information of the "H" level, electrons start to flow from the bit line BL to the memory cell when the potential on the selected word line WLi exceeds $Vcc/2 + V_{TH}$. Since capacitance of a bit line is sufficiently larger than storage capacitance of a memory cell, the memory cell is filled with electrons. As a result, the electron potential under the bit line BL is decreased by a very small voltage $\Delta V_{HR}$. On the other hand, a potential on a reference bit line $\overline{BL}$ paired with the bit line BL does not change at all and remains at a precharge level Vcc/2 because the transistor in the memory cell connected to the reference bit lines remains in an off state. The potential Vcc/2 on the reference bit line $\overline{BL}$ and the potential on the bit line BL to which data is read out are compared by the sense amplifier SA which is activated in response to the rise of the sense amplifier activating signal S (and the fall of the signal $\overline{S}$), so that a potential on the bit line of a lower level, of the pair of bit lines BL and $\overline{BL}$ is amplified to a ground potential GND level and a potential on the bit line of a higher level is amplified to a Vcc level. When the precharge potential on bit lines is Vcc/2, an "L" read-out voltage $\Delta V_{LR}$ and an "H" read-out voltage $\Delta V_{HR}$ are equal to each other.

When an $\overline{RAS}$ active cycle (the time period during which the signal $\overline{RAS}$ is at a low level) is completed, information on the bit line amplified by the sense amplifier SA and then latched thereat is written to the selected memory cell. Then, a word line driving signal and the sense amplifier activating signals S and $\overline{S}$ are made inactive, and the equalize signal EQL rises, so that the bit lines are equalized and precharged.

In the foregoing description, the "L" read-out voltage indicates the magnitude of change in potential, utilizing as a reference a precharge level, which appears on the bit line connected to the selected memory cell after the potential on the word line rises and before a sensing operation by activation of the sense amplifier starts, when the selected memory cell stores information of the "L" level. Similarly, the "H" read-out voltage indicates the magnitude of change in potential, utilizing as a reference a precharge level, which appears on the bit line connected to the selected memory cell after the potential on the word line rises and before the sensing operation by activation of the sense amplifier starts, when the selected memory cell has information of the "H" level.

In restoring information in the selected memory cell, writing information in a normal write mode and refreshing informatin stored in the memory cell in a refresh cycle, informatioon of a full Vcc level can be written to the memory cell by boosting the potential on the word line WLi to more than $Vcc + V_{TH}$. In FIG. 4, a broken line represents an example in which the potential on the word line WLi is boosted up to more than $Vcc + V_{TH}$ and "H" information of the full Vcc level is restored at the end at an $\overline{RAS}$ active cycle (the time period during which the $\overline{RAS}$ signal is at the "L" level).

As capacity of the dynamic RAM is increased, the cell structure is being made finer. At the same time, a junction breakdown voltage, a source/drain breakdown voltage of a transistor, a dielectric breakdown voltage of a gate oxide film or the like are decreased. Thus, in a large capacity DRAM, it becomes difficult to boost the potential on the word line up to more than $Vcc + V_{TH}$. Assuming that a voltage of a high level of the word line is a power-supply voltage Vcc, the following problem occurs.

Figure 5A:
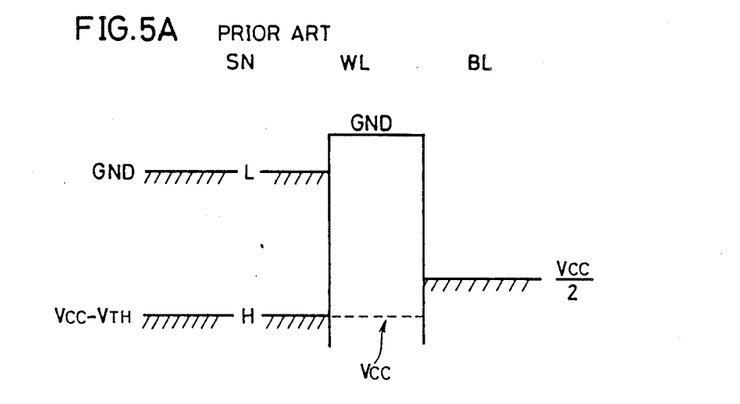
FIG. 5A is a typical diagram showing electron potentials under portions of the memory cell formed when a voltage applied to a word line is at an operating voltage level.
Figure 5B:
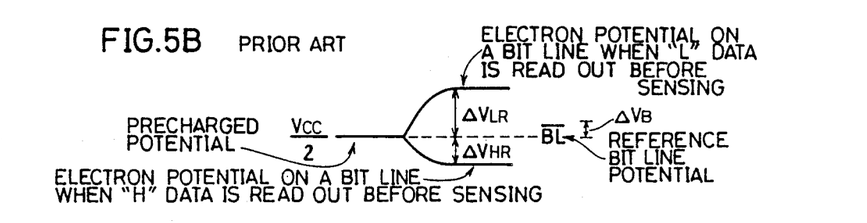
FIG. 5B is a diagram showing an electron potential on a bit line formed when information stored in the memory cell having the electron potentials shown in FIG. 5A is read out.

FIGS. 5A and 5B are a diagram showing an electron potential in a memory cell and a diagram showing by an electron potential a read-out waveform, respectively, assuming that the voltage of a high level of the word line is Vcc, in a conventional dynamic RAM. As shown in FIG. 5A, if the level of the word line is boosted only to the Vcc level, only charges of the (Vcc−$V_{TH}$) level are stored in the storage node SN in the memory cell when writing "H" information. Thus, the change in electron potential which appears on the bit line when information stored in the memory cell is read out to the bit line is to be as shown in FIG. 5B. More specifically, the "L" read-out voltage $\Delta V_{LR}$ and the "H" read-out voltage $\Delta V_{HR}$ have a relation $\Delta V_{LR} > \Delta V_{HR}$. As a result, unbalanced operating margin is provided to a sense amplifier, so that a malfunction of the sense amplifier occurs. For example, the sense amplifier does not correctly amplify a signal voltage on the bit line at the time of sensing operation.

The prior art similar to the structure of the present invention is described in an article by S. Saito et al. entitled "A 1MB CMOS DRAM with Fast Page and Static Column Modes", IEEE International Solid-State Circuits Conference Digest of Technical Papers, Feb. 1985, PP. 252-253. This prior art discloses a "complementary capacitor coupled dummy cell" coupled to a dummy word line and a bit line so as to set a reference bit line to a correct midpoint of Vcc in an active cycle. However, in the prior art, a voltage bootstrapped to more than Vcc is applied to the word line. Consequently, the prior art does not consider a problem of unbalance between the "H" read-out voltage and the "L" read-out voltage to occur when a voltage applied to the word line is a power-supply voltage Vcc level.

SUMMARY OF THE INVENTION

One object of the present invention is to provide, for a DRAM, method of and circuitry for improving stability of data read out therefrom.

Another object of the present invention is to provide, for a DRAM, method of and circuitry for equalizing the magnitude of difference of potential on a bit line pair, as a result of "H" or "L" data on a selected memory cell, as the cell is connected to bit line pair.

A further object of the present invention is to provide a DRAM in which "H" and "L" read out voltages on the bit lines have the same magnitude, without word line boosting.

A DRAM according to the present invention comprises circuitry for applying an equalizing potential to one or the other of paired bit lines to equalize (1) a first difference between a first potential and a second potential and (2) a second differnce between the first potential and a third potential, for balanced read out of the paired bit lines, wherein the first potential appears on a reference bit line paired witha bit line connected to a memory cell selected by an external address prior to sensing thereof, the second potential appears on the bit line when the selected memory cell contains "H" level data and the third potential appears on the bit line when the selected memory cell contains "L" level data.

More specifically when a memory cell comprises an n channel MOS transistor, the dynamic RAM according to the present invention comprises a read-out voltage equalizer by which a potential on a bit line connected to a selected memory cell appearing before sensing operation is increased or a potential on a reference bit line paired with the selected bit line is decreased so that an "L" read-out voltage and an "H" read-out voltage can be equalized. On the other hand, when the memory cell comprises a p channel MOS transistor, the dynamic RAM of the present invention comprises a read-out voltage equalizer by which a potential on a bit line connected to a selected memory cell appearing before sensing operation is decreased or a potential on a reference bit line paired with the selected bit line is increased, thereby reducing an "L" read-out voltage or increasing an "H" read-out voltage, so that an "L" read-out voltage and an "H" read-out voltage can be equalized.

The operating method for a DRAM according to the present invention comprises the step of applying an equalized potential to one or the other of the paired bit lines to equalize (1) a first difference between the above described first potential and the above described second potential and (2) a second difference of potential between the first potential and the above described third potential, for balanced read out of the paired bit lines.

In the dynamic RAM according to the present invention, the magnitude of a differential potential signal appearing on paired bit lines is equalized in reading "H" level data and in reading "L" level data, and therefore, well balanced read out voltage is supplied to a sense amplifer to improve sensing margin thereof and to ensure stable reading operation.

More specifically in the dynamic RAM according to the present invention, since the potential on the bit line connected to the selected memory cell is increased (, or decreased in p type memory cell) or the potential on the reference bit line paired with the bit line is decreased (,or increased in p type memory cell) so that the "L" read-out voltage and the "H" read-out voltage can be equalized, operating margin of a sense amplifier is balanced and a stable read operation is ensured even in the case that the word line is not boosted up to more than a power-supply voltage.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram showing structure of main portions of a memory cell;

DESCRIPTION OF THE PREFERRED EMBODIMENTS

Referring now to FIGS. 5A and 5B, electron potentials on a bit line at the time of reading out "L" information and "H" information before sensing are shown. It is assumed that a memory cell comprises an n channel MOS transistor and a potential on a reference bit line is decreased by $\Delta V_B$. Assuming that capacitance of a bit line is represented by $C_B$ and storage capacitance of a memory cell is represented by $C_S$, the potential on the bit line at the time of reading out the "L" information is given by the following equation $$V_{LR} = Vcc/2 - (C_S \cdot Vcc/2)/(C_B + C_S)$$

and the potential on the bit line at the time of reading out the "H" information is given by the following equation:

$$V_{HR} = Vcc/2 + C_S \cdot (Vcc/2 - V_{TH})/(C_B + C_S)$$

Thus, a middle potential therebetween is as follows:

$$\frac{1}{2}(V_{HR} + V_{LR}) = \frac{1}{2} Vcc - \frac{C_S}{2(C_B + C_S)} \cdot V_{TH} \quad (1)$$

Thus, when $\Delta V_B$, which is the amount of decrease in potential on the reference bit line, is defined as follows:

$$\Delta V_B = C_S \cdot V_{TH}/2(C_B + C_S) \quad (2),$$

an "L" read-out voltage and an "H" read-out voltage are equalized. The "L" read-out voltage and the "H" read-out voltage indicate the difference in the potential between a bit line (BL) and a reference bit line ($\overline{BL}$), respectively, before a sense amplifier is activated for performing sensing operation.

Figure 6:
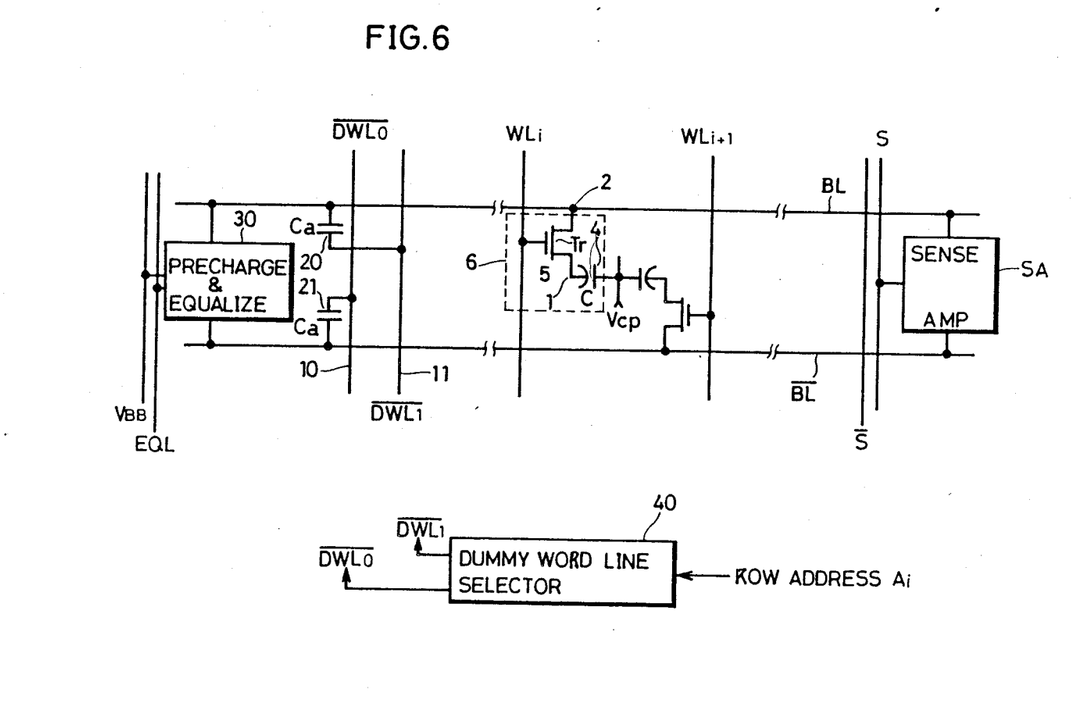
FIG. 6 is a diagram showing structure of main portions of a memory cell array in a DRAM according to an embodiment of the present invention, showing structure of a pair of bit lines and portions associated therewith.

FIG. 6 is a diagram showing structure of a dynamic RAM according to an embodiment of the present invention, showing structure for decreasing a potential on a reference bit line. In the structure shown in FIG. 6, a dummy word line 11 coupled to a bit line BL through a capacitance 20 and a dummy word line 10 coupled to a reference bit line $\overline{BL}$ through a capacitance 21 are additionally provided, in addition to the structure of the conventional dynamic RAM shown in FIG. 2. Both capacitance values of the capacitances 20 and 21 are represented by Ca. The dummy word lines 10 and 11 are driven by signals DWL0 and DWL1 which are responsive to an external address for rendering active (or at an "L" level) a dummy word line capacitor-coupled to a reference bit line paired with a bit line connected to a selected memory cell. More specifically, if and when a read-out voltage appears on the bit line BL, and the bit line $\overline{BL}$ provides a reference level, the signal DWL0 on the dummy word line 10 is rendered active (or at a low level). The dummy word line driving signals DWL1 and DWL0 are generated by a dummy word line selector 40 which is responsive to a row address signal Ai for rendering either of the signals DWL1 and DWL0 active.

When a row address designates the word line WLi, it is necessary that the signal DWL0 on the dummy word line 10 is rendered active. On the other hand, when a row address designates the word line $WL_{i+1}$, it is necessary that the signal DWL1 is rendered active. The dummy word line selector 40 can be easily implemented by structure in which either of the signals DWL0 and DWL1 is rendered active in response to "H" and "L" levels of the 1-bit of the row address, for example.

Similarly to the conventional example, the pair of bit lines BL and $\overline{BL}$ is provided with a sense amplifier SA responsive to sense amplifier activating signals S and $\overline{S}$ being rendered active for differentially amplifying the potential difference between the bit lines BL and $\overline{BL}$, and a precharge/equalize circuit 30 responsive to an equalize signal EQL for maintaining potentials on the bit lines BL and $\overline{BL}$ at a Vcc/2 level after an $\overline{RAS}$ active cycle is completed.

Figure 7:
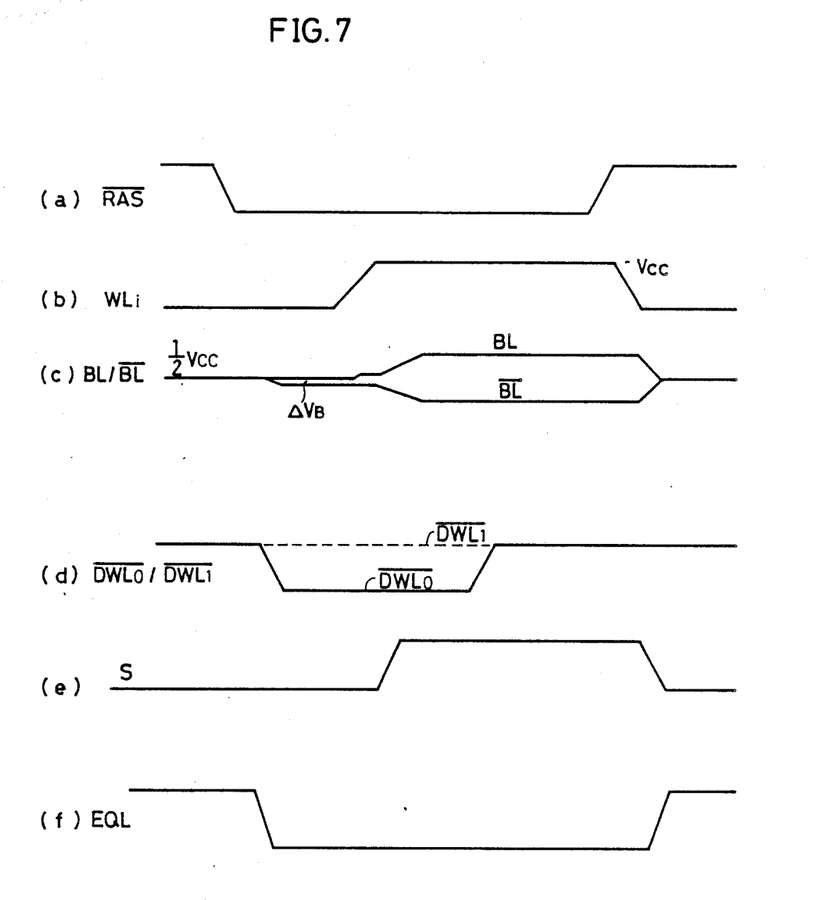
FIG. 7 is a waveform diagram of signals showing a read operation in the DRAM according to an embodiment of the present invention.

FIG. 7 is a waveform diagram showing an operation at the time of reading out "H" information in the dynamic RAM shown in FIG. 6 according to an embodiment of the present invention. Referring now to FIGS. 6 and 7, description is made on the principle of the operation of the dynamic RAM according to an embodiment of the present invention. During a precharge time period, an equalize signal EQL is at the "H" level. Consequently, both bit lines BL and $\overline{BL}$ are short-circuited by the precharge/equalize circuit 30 and held at a precharge level of Vcc/2. Then, when an $\overline{RAS}$ signal enters an active state or a low level in synchronization with an external $\overline{RAS}$ signal, an external address is accepted in the dynamic RAM. Then, an equalize signal EQL falls, so that each of the bit lines is rendered electrically floating.

It is assumed that the accepted external address designates a memory cell 6 connected to the bit line BL. In this case, the dummy word line selector 40 is responsive to the accepted external address for changing to an active state, i.e., to the "L" level the dummy word line activating signal DWL0 applied to the dummy word line 10 capacitor-coupled to the reference bit line $\overline{BL}$ providing a reference level with respect to the bit line BL by the capacitance 21. The dummy word line activating signal DWL1 applied to the other dummy word line 11 remains in an inactive state, i.e., at the "H" level. Since the dummy word line 10 at the "L" level and the reference bit line $\overline{BL}$ are capacitor-coupled through the capacitance 21, a potential on the reference bit line $\overline{BL}$ is decreased from the precharge level Vcc/2 to the level of (Vcc/2)−ΔV$_B$, where ΔV$_B$ is a value obtained by the equation (2).

Then, a single word line is selected in response to the external address and potential on the selected word line WLi rises to be at a power-supply voltage Vcc level, so that the change in potential responsive to information stored in a memory cell connected to the selected word line WL appears on the bit line BL. In FIG. 7, a case is shown in which the selected memory cell stores information of the "H" level. Then, the sense amplifier activating signal S rises (the signal $\overline{S}$ falls) and the sense amplifier SA is activated, so that sensing operation (detection and amplification of the potential difference between the pair of bit lines BL and $\overline{BL}$) starts.

As described above, the potential on the reference bit line $\overline{BL}$ is decreased from Vcc/2 by ΔV$_B$ so that the "L" read-out voltage and the "H" read-out voltage are equalized, so that stable operation is obtained even if the word line WLi is not boosted up to more than the power-supply voltage Vcc.

Although in the present embodiment, an example was shown in which the potential on the selected dummy word line falls before the potential on the selected word line WLi rises, any timing after completion of the equalize cycle and before the sensing operation by which the sense amplifier is activated may be used, in which case the same effect can be obtained. Description is now made on capacitance values Ca of the capacitances 20 and 21.

If and when the amplitudes of the dummy word line activating signals DWL0 and DWL1 applied to the dummy word lines 10 and 11 are the power-supply voltage Vcc, the magnitude ΔV$_B$ of decrease in potential on the reference bit line capacitor-coupled to an activated dummy word line is obtained by the following equation, assuming that capacitance of the bit line (including Ca) is represented by C$_B$:

$$V_B = Ca \cdot Vcc/C_B$$

Thus, from the equation (2), the following equation is obtained:

$$Ca = \frac{C_S \cdot C_B}{2(C_B + C_S)} \cdot \frac{V_{TH}}{Vcc}$$

In characteristics of the MOS transistor, a threshold voltage V$_{TH}$ of the transistor Tr of the memory cell is increased when the voltage Vcc applied to the gate thereof is increased. The ratio V$_{TH}$/Vcc is almost constant, i.e., about 0.2 in the normal operating range of Vcc.

When the voltage Vcc applied to the gate is increased, the threshold voltage V$_{TH}$ of the MOS transistor is increased for the following reason. In a semiconductor device such as a memory, a bias potential is generally applied to a substrate so as to stabilize operation of transistors by, for example, preventing the change in threshold voltage of the transistor and preventing the back gate effect. The substrate bias potential is generated from a power-supply voltage Vcc using a charge pump or the like. Accordingly, the value of the bias potential is changed such that the higher the power-supply voltage Vcc (the voltage applied to the gate) is, the deeper bias is. When the substrate bias becomes deep, the threshold voltage of the MOS transistor formed on the substrate is increased. Thus, when the power-supply voltage Vcc, i.e., the voltage applied to the gate is increased, the threshold voltage of the MOS transistor is also increased.

As described above, since V$_{TH}$/Vcc=0.2 in the normal operating range of the power-supply voltage Vcc, the capacitance value Ca is as follows:

$$Ca \approx 0.2 \cdot C_S \cdot C_B/2(C_B + C_S)$$
$$= C_S \cdot C_B/10(C_B + C_S)$$

In addition, C$_B$>>C$_S$ (this relation is generally satisfied in a large capacity DRAM, $$Ca = C_S/10$$

Thus, if coupling capacitance of about 1/10 of storage capacitance of the memory cell is provided, an operation without any loss of stable operating margin is ensured. Furthermore, since the amount of ΔV$_B$ of change in potential on the reference bit line is as small as 10 mV (C$_B$≈0.5 pF, C$_S$≈50 fF), a low power consumption characteristic which is an advantage of a Vcc/2 bit line precharge technique is maintained.

Figure 8:
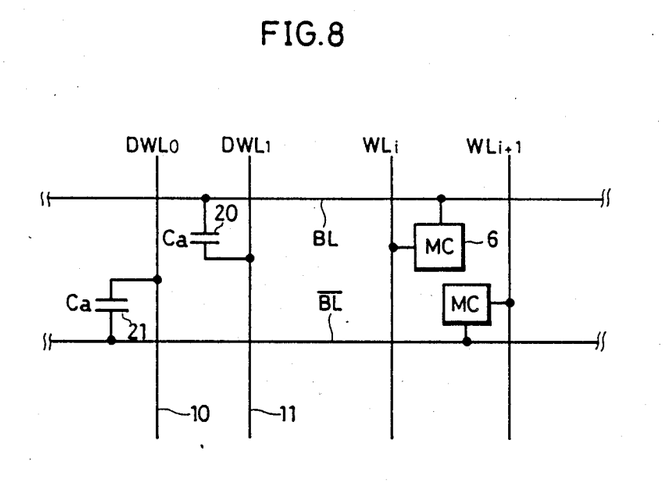
FIG. 8 is a diagram showing schematically structure of a memory cell array in a DRAM according to another embodiment of the present invention.

In a scheme in which a potential on the bit line connected to the selected memory cell is increased, a potential on the bit line is increased by the same magnitude of that of decrease in the potential of the reference bit line in the above described embodiment. This scheme is easily achieved if the same structure as that shown in FIG. 6 is used and dummy word lines are provided which attain a high level in an active state before sensing operation in which the sense amplifier SA is activated. More specifically, it is necessary that in the structure as shown in FIG. 8, the signals DWL0 and DWL1 the active state of which is the "H" level are used as dummy word line activating signals, and a dummy word line capacitor-coupled to the bit line connected to the selected memory cell is selected on selection of a dummy word line to increase a potential on the selected dummy word line. For example, when the bit line connected to the selected memory cell is a bit line BL in FIG. 8, the dummy word line 11 is selected to change the dummy word line driving signal DWL1 from a low level to a high level. As a result, the bit line BL in a floating state is capacitor-coupled to the dummy word line 11 of a high level through the capacitance 20, and the potential of the selected bit line is increased by ΔV$_B$. A dummy word line can be selected by using the same structure as that of the dummy word line selector 40 shown in FIG. 6 with the signal levels or conductivity types of transistors thereof reversed. Such a structure may be employed in which a potential on the bit line connected to the selected memory cell is increased to obtain the same effect as the above described embodiment. In other words, with such a structure, the "H" read-out voltage and "L" read-out voltage can be equalized, so that operating margin of the sense amplifier can be improved.

Figure 9:
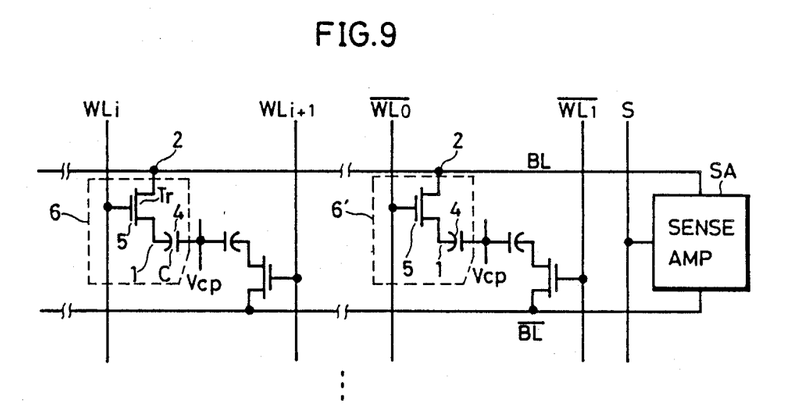
FIG. 9 is a diagram showing structure of main portions of a memory cell array in a DRAM employing a dummy reversal technique according to another embodiment of the present invention, showing a pair of bit lines and portions associated therewith.

FIG. 9 is a diagram showing an example of structure of a memory cell array comprising dummy word lines WL0 and WL1, which has been conventionally often used. A memory cell 6 and a dummy cell 6′ have the same structure and are connected to the same bit line. In a dummy reversal technique, a potential on only the dummy word line WL0 falls immediately before a single word line WLi is selected in response to an external address so that a potential on the selected word line WLi rises. Thereafter, information is read out. Precharging of a bit line is performed at the time of starting of accessing to a memory. The dummy word lines WLO and WL1 are at an "H" level at the precharge time and at the standby time. By employing the dummy reversal technique, it is intended that coupling noise between the word line and the bit line through gate capacitance of a transistor Tr in a selected memory cell is cancelled. A dynamic RAM of the dummy reversal technique is described in, for example, an article by Suzuki et al., entitled "A 128K Word ×8 Bit Dynamic RAM", IEEE Journal of Solid-State Circuits, Vol. SC-19, No. 5, Oct. 1984, PP. 624–626. In the case of the dynamic RAM of the dummy reversal technique having such structure, if the size of the MOS transistor 5 included in the dummy cell 6' is appropriately adjusted, a potential on the bit line connected to the selected memory cell can be increased. The size of the transistor 5 (for example, the width, the legnth or the area of a gate of the transistor) in the dummy cell 6' is adjusted such that the difference between the floating-up of the potentianl on the bit line due to the gate capacitance of the transistor Tr of the memory cell 6 and the magnitude of decrease in potential on the bit line due to the gate capacitance of the transistor 5 in the dummy cell 6' provides the increased potential on the bit line by the above described $\Delta V_B$. Alternately, if, in the DRAM of the dummy reversal technique, a potential of a signal applied to the dummy word line is reversed and the gate capacitance of the transistor in the dummy cell may be the above described value Ca, the same effect as the above described embodiments can be obtained.

Although in the above described embodiments, cases were described in which a memory cell comprises an n channel MOS transistor, the same problem occurs if the memory cell comprises a p channel MOS transistor. In this case, polarity of each signal is only reversed. Consequently, a precharge potential on a bit line connected to a selected memory cell may be decreased or a precharge potential on a reference bit line paired with the bit line may be increased, on the basis of the same principle, in which case the same effect as the above described embodiment can be obtained.

As described in the foregoing, according to the present invention, since a precharge potential on a bit line connected to a selected memory cell is increased (, or decreased in a p type memory cell) or a precharge potential on a reference bit line paired with the bit line is decreased (or increased in p type memory cell) so that an "L" read-out voltage and an "H" read-out voltage are equalized to each other, a stable reading out operation can be ensured without losing operating margin of a sense amplifier even if a word line is not boosted up to more than a power-supply voltage Vcc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by, and external address and a reference bit line of applying a reference potential are paired with each other, the amplitude of a signal supplied to each of said word lines being substantially an operating power-supply voltage Vcc and each of said bit lines being precharged to one-half of said operating power-supply voltage of Vcc/2 level before a word line selected by said external address is changed to an active state, wherein a first potential appears on said reference bit line, a second potential appears on the selected bit line when the selected memory cell contains "H" level data and third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein said memory cell comprises an N channel MOS transistor and said means for applying an equalizing potential increases the potential on the selected bit line connected to the selected memory cell with respect to the precharge level of Vcc/2 by a predetermined value.

2. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of said operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein each of said memory cells comprises N channel MOS transistor and said means for applying an equalizing potential decreases the potential on the reference bit line paired with the selected bit line connected to the selected memory cell with respect to said precharge level of Vcc/2 by a predetermined value.

3. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of selected bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of said operating power-supply voltage Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein each of said memory cells comprises a P channel MOS transistor and said means for applying an equalizing potential decreases the potential on the selected bit line connected to the selected memory cell with respect to said precharge level of Vcc/2 by a predetermined value.

4. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of said operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein each of said memory cell comprises a P channel MOS transistor and said means for applying an equalizing potential increases the potential on the reference bit line paired with the selected bit line connected to the selected memory cell with respect to said precharge level of Vcc/2 by a predetermined value.

5. A semiconductor dynamic random access memory according to claims 1, 2, 3 or 4, wherein said means for applying an equalizing potential comprises capacitance means coupled to each bit line of said plurality of bit line pairs.

6. A semiconductor dynamic random access memory according to claim 5, wherein said capacitance means comprises a coupling capacitance having one electrode coupled to a respective bit line of the bit line pairs and another electrode connected to a signal line which is rendered active before said sensing operation.

7. A semiconductor dynamic random access memory according to claim 6, wherein the amplitude of a signal applied to said signal line is said operating power-supply voltage Vcc, a capacitance value of each bit line is represented by $C_B$, storage capacitance of said memory cell is represented by $C_S$ and a threshold voltage of a transistor included in a memory cell is represented by $V_{TH}$, a capacitance value Ca of said coupling capacitance is defined by the following equation:

$$Ca = \frac{C_S \cdot C_B}{2(C_B + C_S)} \cdot \frac{V_{TH}}{Vcc}$$

8. A semiconductor dynamic random access memory according to claim 6, wherein the amplitude of the signal applied to said signal line is said operating power-supply voltage Vcc, a capacitance value of each bit line including a capacitance value of said coupling capacitance is represented by $C_B$ and storage capacitance of said memory cell is represented by $C_S$, a capacitance value Ca of said coupling capacitance is defined, by $Ca = C_S \cdot C_B/10(C_B+C_S)$. The following equation: CA=

9. A semiconductor dynamic random access memory according to claim 6, wherein the amplitude of the signal applied to said signal line is said operating power-supply voltage Vcc and storage capacitance of said memory cell is represented by $C_S$, a capacitance value Ca of said coupling capacitance is defined by Ca=by the the following equation: $C_S/10$. The following equation:

10. A semiconductor dynamic random access memory according to claim 5, wherein said semiconductor dynamic random access memory comprises a plurality of dummy cells each including a dummy MOS transistor coupled to a capacitance, each dummy transistor having a conduction terminal connected to a respective bit line and a gate connected to a respective dummy word line the value of capacitance coupled to each bit line being depended upon the size of the respective dummy MOS transistor.

11. Operating method for a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, said method comprising the steps of:

applying an equalizing potential to one or the other of said paired bit lines to equalize (1) a first difference between said first potential and a said second potential and (2) a second difference between said first potential and said third potential, for balanced readout of said paired bit lines, and sensing the voltage between the paired bit lines, wherein said step of applying an equalizing potential comprises the step of capacitively coupling a selected one of the paired bit lines to an activated signal line, and wherein said capacitively coupling step comprises the step of coupling a selected bit line connected to a selected memory cell to the activated signal line.

12. The method according to claim 11, wherein each of said memory cells comprises an n channel MOS transistor, and said activated signal line is at "H" level.

13. The method according to claim 11, wherein each of said memory cells comprises a p channel MOS transistor, and said activated signal line is at "L" level.

14. Operating method for a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selective bit line connected to a memory cell selected by an external address and a reference bit line for applying a reference potential are paired with each other, the amplitude of a signal supplied to each of said word lines being substantially an operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, said method comprising the steps of:

applying an equalizing potential to one or the other of said paired bit lines to equalize (1) a first difference between said first potential and a said second potential and (2) a second difference between said first potential and said third potential, for balanced readout of said paired bit lines, and sensing the voltage between the paired bit lines, wherein said step of applying an equalizing potential comprises the step of capacitively coupling a selected one of the paired bit lines to an activated signal line, and wherein said capacitively coupling step comprises the step of coupling a reference bit line paired with the selected bit line connected to a selected memory cell to the activated signal line.

15. The method according to claim 14, wherein each of said memory cells comprises an n channel MOS transistor, and said activated signal line is at "L" level.

16. The method according to claim 14, wherein each of said memory cells comprises a p channel MOS transistor, and said activated signal line is at "H" level.

17. A semiconductor dynamic random access memory comprising;

a plurality of memory cells arranged in a matrix of rows and columns, each said memory cell including an N channel MIS transistor having a gate electrode, and one storage means;

a plurality of word lines, one for each said row, each said word line being connected to respective gate electrodes of the memory cells on an associated row and having applied thereon an operating power-supply voltage Vcc when selected by a row decoder in response to an externally applied address;

a plurality of bit line pairs, one pair for each said column, each said bit line pair connected to memory cells on an associated column;

a plurality of equalizing means, one provided for each said column, each said equalizing means, being connected between the bit lines of an associated bit line pair on a corresponding column, for setting at a reference potential equal to half said operating power supply voltage the bit lines of the associated bit line pair before selection of a word line by the row decoder;

a plurality of sense amplifier means, one for each said column, each said sense amplifier means sensing and amplifying a potential difference in an associated bit line pair provided on a corresponding column;

said equalizing means including means for shifting down a reference bit line potential or shifting up a selected bit line potential before sensing by said sense amplifier means, and, a plurality of bit line potential adjusting means, one provided for each column, each said bit line potential adjusting means being coupled to a bit line pair of an associated column and making substantially equal (1) a potential difference between said reference potential and a potential on a bit line to which a memory cell is connected when that memory cell is connected to a selected word line and stores "H" level information and (2) a potential difference between said reference potential and a potential on a bit line to which a memory cell is connected when that memory cell is connected to the selected word line and stores "L" level information.

18. A memory according to claim 17, wherein each said adjusting means comprises a pair of dummy word lines arranged in the row direction and a pair of dummy cells, each said dummy cell comprises an N channel MIS transistor having a gate electrode connected to a respective dummy word line of said pair of dummy word lines, and one conduction terminal connected to a respective bit line of the bit line pair of a corresponding column, and storage means connected between the other conduction terminal of the N channel MIS transistor and a predetermined potential.

19. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a select bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of said operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein said means for applying an equalizing potential comprises capacitance means coupled to each of said plurality of bit lines;

wherein said capacitance means comprises coupling capacitance having one electrode coupled to a respective bit line and another electrode connected to a signal line which is rendered active before said sensing operation; and wherein the amplitude of a signal applied to said signal line is said operating power-supply voltage VCC, a capacitance value of each bit line is represented by $C_B$, storage capacitance of said memory cell is represented by $C_S$ and a threshold voltage of a transistor included in a memory cell is represented by $V_{TH}$, a capacitance value Ca of said coupling capacitance is defined by the following equation:

$$Ca = \frac{C_S \cdot C_B}{2(C_B + C_S)} \cdot \frac{V_{TH}}{Vcc}$$

20. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of said operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein said means for applying an equalizing potential comprises capacitance means coupled to each of said plurality of bit lines;

wherein said capacitance means comprises coupling capacitance having one electrode coupled to a respective bit line and another electrode connected to a signal line which is rendered active before said sensing operation; and wherein the amplitude of the signal applied to said signal line is said operating power-supply voltage Vcc, a capacitance value of each bit line including a capacitance value of said coupling capacitance is represented by $C_B$ and storage capacitance of said memory cell is represented by $C_S$, a capacitance value Ca of said coupling capacitance is defined by $C_S \cdot C_B / 10(C_B + C_S)$.

21. In a semiconductor dynamic random access memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of said operating power-supply voltage of Vcc/2 level before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said firt potential and said second potential and (2) a second difference between said first potential and said third potential, for balanced readout of said paired bit lines, wherein said means for applying an equalizing potential comprises capacitance means coupled to each of said plurality of bit lines;

wherein said capacitance means comprises coupling capacitance having one electrode coupled to a respective bit line and another electrode connected to a signal line which is rendered active before said sensing operation; and wherein the amplitude of the signal applied to said signal line is said operating power-supply voltage Vcc and storage capacitance of said memory cell is represented by $C_S$, a capacitance value Ca of said coupling capacitance is defined by $Ca = C_S/10$.

22. In a semiconductor dynamic random acess memory comprising a plurality of memory cells arranged in a matrix of rows and columns each storing digital information of "H" or "L" level, a plurality of word lines each for selecting one row in said plurality of memory cells and a plurality of bit lines each connected to one column in said plurality of memory cells, said plurality of bit lines being arranged in such a configuration that a selected bit line connected to a memory cell selected by an external address and a reference bit line for applying a reference potential are paired with each other, the amplitude of a signal supplied to each of said word lines being substantially an operating power-supply voltage Vcc and each of said bit lines being precharged to one-half of asid operating power-supply voltage before a word line selected by said external address is changed to an active state, wherein a first potential appears on said reference bit line, a second potential appears on the selected bit line when the selected memory cell contains "H" level data and a third potential appears on the selected bit line when the selected memory cell contains "L" level data, the voltage across said paired bit lines being subject to a sensing operation, an improvement comprising:

means for applying an equalizing potential to one of said paired bit lines to equalize (1) a first difference between said first potential and said second potential and (2) a second difference between said first potential and said third potential, for balanced readout of said paired bit lines, wherein said means for applying an equalizing potential comprises capacitance means coupled to each of said plurality of bit lines; and wherein said capacitance means comprises two dummy cells, each including a dummy MOS transistor coupled to a capacitance, each dummy transistor having a conduction terminal connected to a respective bit line and a gate connected to a dummy word line, the value of capacitance coupled to each of the bit lines being depended upon the size of the dummy MOS transistor.

* * * * *